United States Patent [19]
Chen et al.

[11] Patent Number: 5,564,180
[45] Date of Patent: Oct. 15, 1996

[54] METHOD OF FABRICATING DRAM CELL CAPACITOR

[75] Inventors: Anchor Chen, Ping-Tung; Gary Hong, Hsinchu, both of Taiwan

[73] Assignee: United Microelectronics Corp., Hsinchu, Taiwan

[21] Appl. No.: 338,684

[22] Filed: Nov. 14, 1994

[51] Int. Cl.$^6$ .................................................. H01L 21/70
[52] U.S. Cl. ............................ 29/840; 257/301; 257/302; 437/52
[58] Field of Search .................... 29/840, 825; 437/52, 437/72; 257/301, 302

[56] References Cited

U.S. PATENT DOCUMENTS

| | | | |
|---|---|---|---|
| 4,845,539 | 7/1989 | Inoue | 257/302 |
| 5,066,608 | 11/1991 | Kim et al. | 437/52 |
| 5,273,925 | 12/1993 | Yamanaka . | |
| 5,362,665 | 11/1994 | Lu . | |
| 5,396,456 | 3/1995 | Liu et al. | 257/301 X |
| 5,399,520 | 3/1995 | Jang | 437/72 X |
| 5,416,037 | 5/1995 | Sato et al. . | |
| 5,429,977 | 7/1995 | Lu et al. | 437/52 |

FOREIGN PATENT DOCUMENTS 4-267370  9/1992  Japan .................................. 257/301

*Primary Examiner*—Carl J. Arbes
*Attorney, Agent, or Firm*—Ladas & Parry

[57] ABSTRACT

A new capacitor configuration and its method of manufacture. The capacitor, which may be used with DRAM cells, is made on a substrate having a gate electrode, source/drain areas, and a first insulating layer containing a first contact opening formed therein. A first conducting layer is formed overlying the insulating layer and connected to the source/drain areas through the first contact opening. Next, the steps are performed repeatedly as follows. A first dielectric layer, a second conducting layer, a second dielectric layer, and a third conducting layer are sequentially formed overlying the first conducting layer and the first insulating layer. Portions of the third conducting layer, the second dielectric layer, and the second conducting layer are etched to form a second contact opening. Sidewall spacers are formed on the side walls of the second contact opening. A fourth conducting layer is formed overlying the third conducting layer and connected to the first conducting layer through the second contact opening. The fourth conducting layer and the third conducting layer are patterned by etching to define the periphery of capacitor. The first, third, and fourth conducting layers define a first electrode plate while the second conducting layer defines a second electrode plate. The electrode plate surface area of a capacitor can be increased resulting in a higher capacitance.

5 Claims, 3 Drawing Sheets

METHOD OF FABRICATING DRAM CELL CAPACITOR

BACKGROUND OF THE INVENTION

1. Field of the Invention

This invention relates to the fabrication of integrated circuit (IC) devices, and more particularly to a new method of fabricating dynamic random access memory (DRAM) cell capacitor which has multi-layered stacked electrode plate configuration which improves its capacitance. This invention also relates to the configuration of this new capacitor.

2. Description of the Prior Art

Dynamic random access memory (DRAM), which comprises an array of memory cells, is a widely utilized integrated circuit (IC) device. Each memory cell in the array comprises, as shown in FIG. 1, a metal-oxide semiconductor field-effect transistor (MOSFET) 10 and a capacitor 12. The gate terminal of the MOSFET 10 is connected to a word line (WL), and the other two terminals (source and drain) of the MOSFET 10 are connected to the capacitor 12 and a bit line (BL), respectively. When reading the contents of the memory cell, the gate terminal receives a pulse on the word line WL to turn-on the MOSFET 10. The capacitor 12 is then discharged and the bit of data stored therein is sent out the bit line (BL). On the other hand, when writing data to the memory cell, data is provided on the bit line and the gate terminal receives a pulse through the word line to turn-on the MOSFET 10. The capacitor 12 is then charged to store the data on the bit line.

As is well known to persons skilled in this art, a capacitor is utilized for the storage of the data content of each memory cell. The bit in question, either a one or a zero, as stored in the memory cell, is determined by whether or not the capacitor is charged or discharged. Due to the inherent nature of the DRAM design, the capacitor should possess high capacitance in order to maintain its data content for as long a period of time as possible.

A stacked capacitor is a commonly used structure in DRAM cells. Referring to FIG. 2, there is shown a silicon substrate 2. Field oxide 20, gate electrode 32, and source/drain areas 30 are formed on the silicon substrate 2 successfully. A silicon dioxide layer 24 is deposited over the gate electrode 32 and source/drain areas 20, wherein a contact opening is formed therein to expose the desired source/drain areas 30. A first polysilicon layer 34 (bottom electrode plate of the stacked capacitor), a dielectric layer 36, such as nitride/oxide (NO) or oxide/nitride/oxide (ONO) layers, and a second polysilicon layer 38 (top electrode plate of the stacked capacitor) are next formed on the silicon dioxide layer 24, respectively, so as to construct a cell capacitor. The first polysilicon layer 34 is connected to the desired source/drain areas 30 through the contact opening within the silicon dioxide layer 24.

With the continuous increase of device density on integrated circuits, the DRAM cell area is getting smaller which results in a smaller capacitor and hence less capacitance. There are two methods to increase the capacitance: (i) decrease the effective dielectric thickness and (ii) increase the capacitor's surface area. However, higher capacitance values cannot be obtained without seriously degrading the device retention time because dielectric films thinner than 50 Å presently have excessive leakage currents due to direct carrier tunneling. For a given capacitor dielectric film, the larger the surface area of the storage electrodes, the higher the capacitance. Using trenched capacitors for DRAM cells is another scheme for increasing capacitance. The trenched capacitor is formed within a trench nearby a transistor device. This kind of capacitor suffers from a reduced etch rate for high-aspect-ratio trenches, and thus the processing is time consuming and hence expensive. Also, inevitable crystalline defects occur by this process.

SUMMARY OF THE INVENTION

It is therefore an object of the present invention to provide a DRAM cell capacitor which has larger surface area of electrode plate so that its capacitance is increased.

In accordance with the object of this invention, a new method of fabricating stacked DRAM cell capacitor on a substrate having a gate electrode, source/drain areas, and a first insulating layer containing a first contact opening formed therein is described. A first conducting layer is formed overlying the insulating layer and connected to the source/drain areas through the first contact opening. Next, the steps are performed repeatedly as follows. A first dielectric layer, a second conducting layer, a second dielectric layer, and a third conducting layer are sequentially formed overlying the first conducting layer and the first insulating layer. Portions of the third conducting layer, the second dielectric layer, and the second conducting layer above the first contact opening are etched to form a second contact opening. Sidewall spacers are formed on the side walls of the second contact opening by depositing and etching back a second insulating layer. Any remaining portion of the first dielectric layer within the second contact opening is also removed to expose the first conducting layer. A fourth conducting layer is formed overlying the third conducting layer and connected to the first conducting layer through the second contact opening. Finally, the fourth conducting layer and the third conducting layer are patterned by etching completing the DRAM cell capacitor, wherein the first, third, and fourth conducting layers construct a first electrode plate, the second conducting layer constructs a second electrode plate. Thus, the electrode plate surface area of the capacitor can be improved resulting in a higher capacitance.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

A first preferred embodiment of the invention will now be described with reference to FIGS. 3A and 3B.

Figure 1:
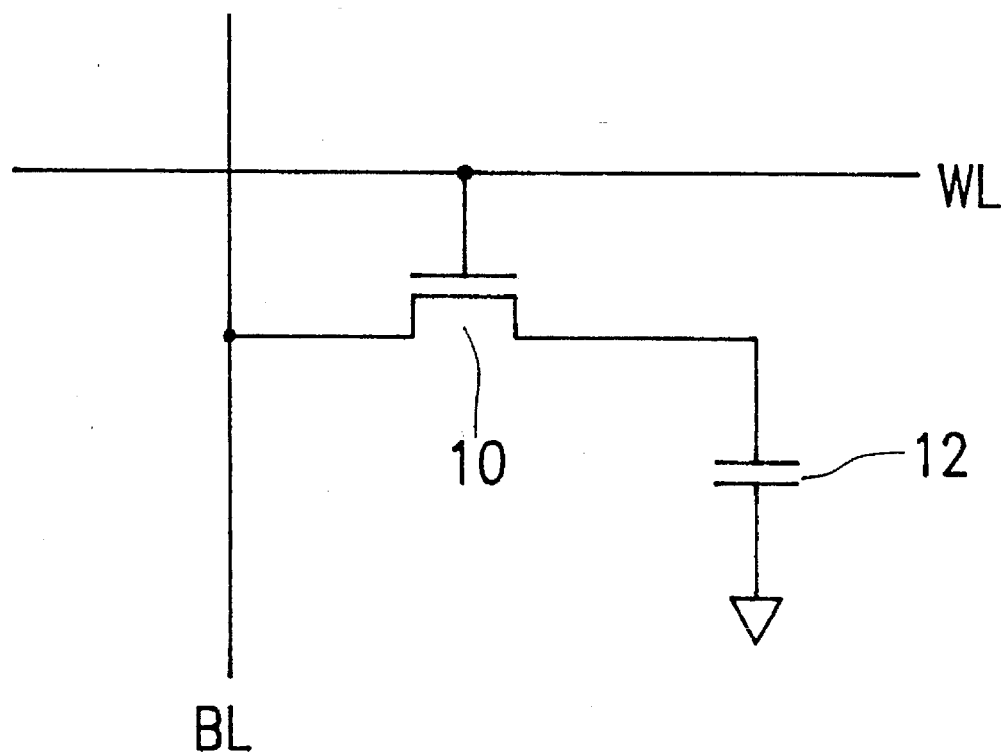
FIG. 1 is a schematic circuit diagram showing a memory cell of a DRAM device.
Figure 2:
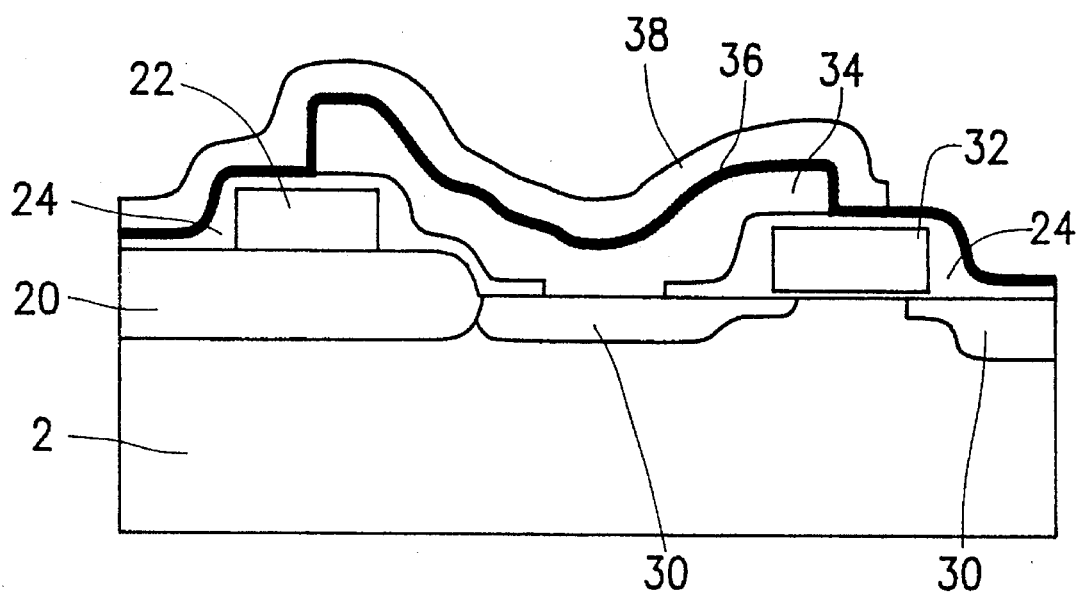
FIG. 2 is a cross sectional view of a prior art stacked capacitor of DRAM cell.
Figure 3A:
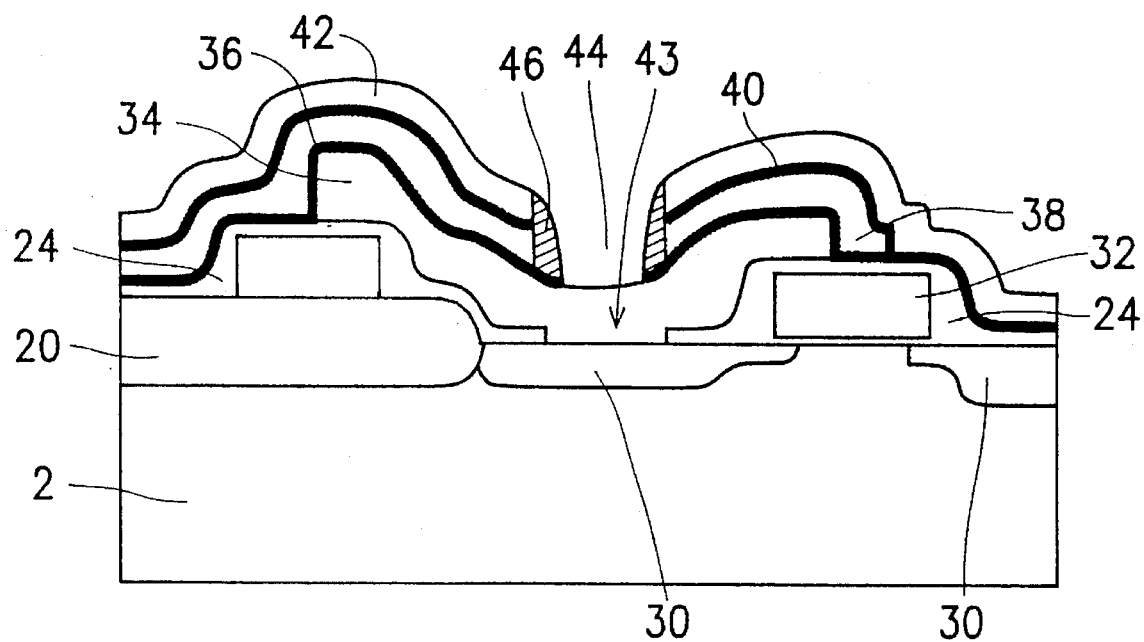
FIGS. 3A to 3B illustrate in cross sectional view a preferred embodiment of DRAM cell capacitor in accordance with the present invention so as to show the fabricating processes.

Referring now more particularly to FIG. 3A, there is shown a silicon substrate 2. A field oxide 20 and a transistor device having a gate electrode 32 and $N^+$ source/drain areas 30 are formed in the silicon substrate 2 by conventional processes. A first insulating layer 24, such as a silicon dioxide layer, is formed on the transistor preferably by chemical vapor deposition (CVD). A first contact opening 43 is next formed in the first insulating layer 24 by lithography and etching procedures which are used to expose the desired source/drain areas 30.

A first conducting layer 34, such as a doped polysilicon layer, is formed and patterned on the surface of the first insulating layer 24, which electrically contacts the desired source/drain areas 30 through the contact opening 43. A first dielectric layer 36 is formed overlying the first conducting layer 26 and the first insulating layer 24 by CVD. A second conducting layer 38 is formed on the first dielectric layer 36 by CVD and then patterned by etching. Next, a second dielectric layer 40 and a third conducting layer 42 are sequentially formed overlying the second conducting layer 38 by CVD. For example, the first and second dielectric layers 36 and 40 are preferably nitride/oxide layers, the second and third conducting layers 38 and 42 are preferably doped polysilicon layers. Portions of the third conducting layer 42, the second dielectric layer 40, and the second conducting layer 38 above the first contact opening 43 are etched, preferably by reactive ion etching (RIE), to form a second contact opening 44. Sidewall spacers 46 are formed on the side walls of the second contact opening 44 by depositing and etching back a silicon dioxide layer, again, preferably by RIE. In FIGS. 3A–3C, the etch forming the second contact opening 44 stops at first dielectric layer 36 and the sidewall spacers 46 are disposed over that dielectric layer. Alternatively, the etch may proceed through dielectric layer 36 so that the sidewall spacers 46 will instead sit on first conducting layer 34.

Figure 3B:
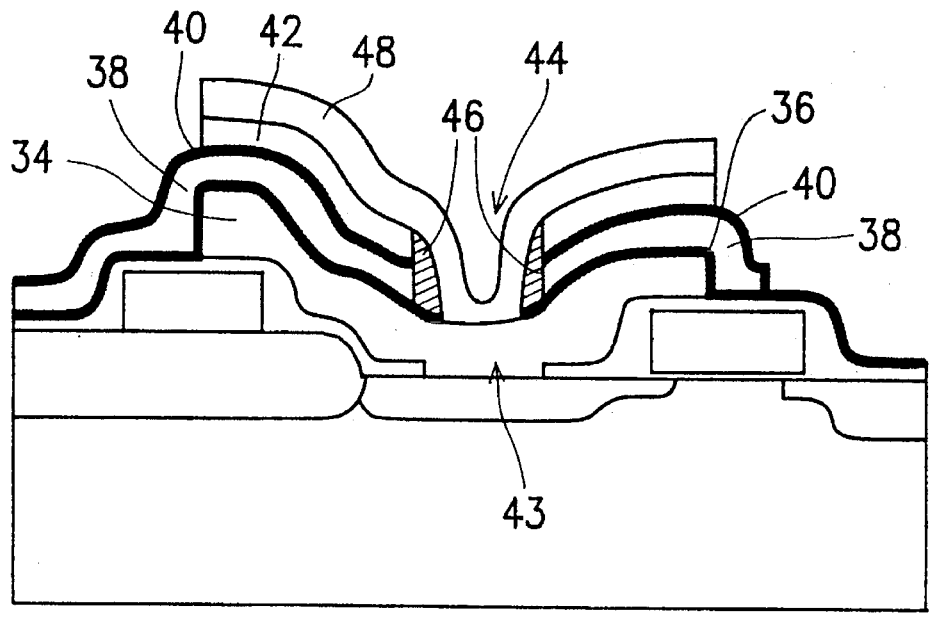
Figure 3C:
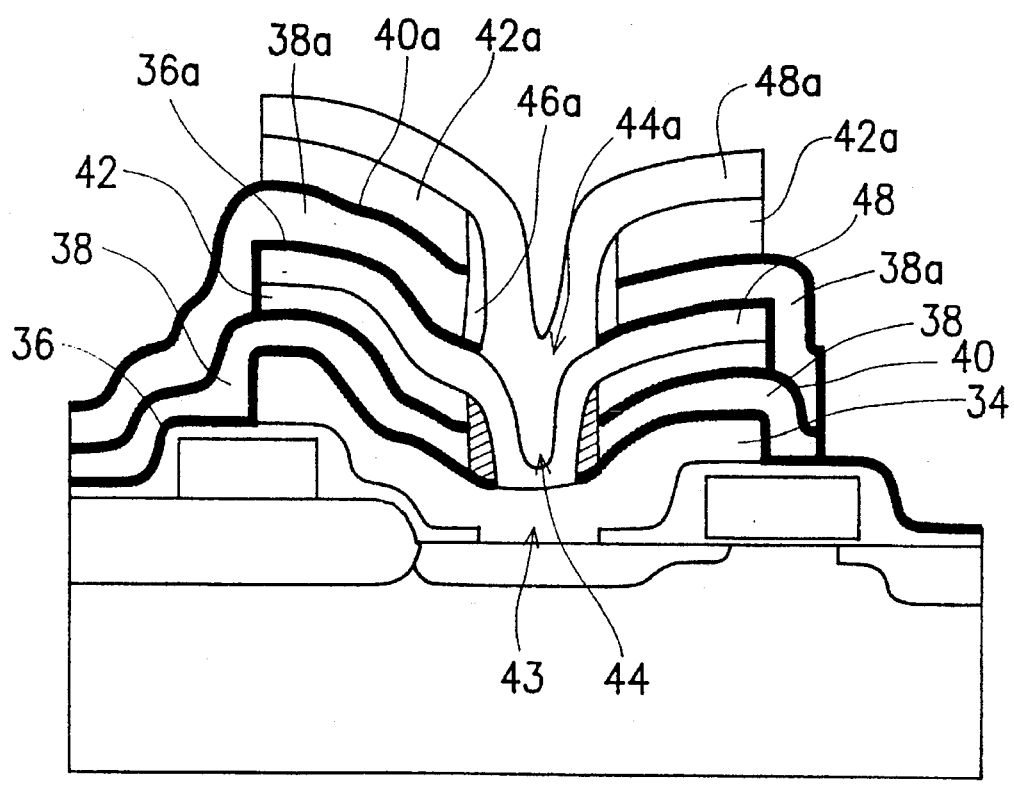
FIG. 3C shows a cross sectional view of another preferred embodiment of DRAM cell capacitor in accordance with the present invention.

Referring to FIG. 3B, a fourth conducting layer 48, such as a doped polysilicon layer, is formed overlying the third conducting layer 42, preferably by CVD. Layer 48 is electrically connected to the first conducting layer 34 through the second contact opening 44. A photoresist layer (not shown) is coated and patterned on the fourth conducting layer 48 by using conventional lithography procedures to form a prospective electrode plate mask layer. Portions of the fourth and third conducting layers 48 and 42 not covered by the mask layer are etched away, preferably anisotropicly by RIE, to define a pattern completing the DRAM cell capacitor. The first, third, and fourth conducting layers 34, 42, and 48 define a first electrode plate of the capacitor, while the second conducting layer 38 defines a second electrode plate of the capacitor. The surface area of the electrode plate of the DRAM cell capacitor is improved which leads to a higher capacitance.

In order to further increase the surface area of the electrode plates, the above mentioned steps can be performed repeatedly, as many times as desired. FIG. 3C shows a cross sectional view of a second preferred embodiment of DRAM cell capacitor in accordance with the present invention in which the above mentioned steps have been repeated once. The fabricating steps will now be described in greater detail.

A third dielectric layer 36a is formed overlying the fourth conducting layer 48 and the second dielectric layer 40 by CVD. A fifth conducting layer 38a is formed on the third dielectric layer 36a by CVD and then patterned by etching. Next, a fourth dielectric layer 40a and a sixth conducting layer 42a are sequentially formed overlying the fifth conducting layer 38a by CVD. For example, the third and fourth dielectric layers 36a and 40a are preferably nitride/oxide layers, the fifth and sixth conducting layers 38a and 42a are preferably doped polysilicon layers. The fifth conducting layer 38a is electrically connected to the second conducting layer 38, for example, by a metal layer (not shown) formed outside the prospective electrode plate area. Portions of the sixth conducting layer 42a, the fourth dielectric layer 40a, and the fifth conducting layer 38a above the second contact opening 44 are etched away, preferably anisotropicly by RIE, to form a third contact opening 44a. Sidewall spacers 46a are formed on the side walls of the third contact opening 44a preferably by depositing and etching back a silicon dioxide layer.

A seventh conducting layer 48a, such as a doped polysilicon layer, is formed overlying the sixth conducting layer 42a. It is preferably formed by CVD and is connected to the fourth conducting layer 48 through the third contact opening 44a. A photoresist layer (not shown) is coated and patterned on the seventh conducting layer 48a by using conventional lithography procedures to form a prospective electrode plate mask layer. Portions of the seventh and sixth conducting layer 48a and 42a not covered by the mask layer are etched away by RIE to define pattern completing the DRAM cell capacitor. The first, third, fourth, sixth and seventh conducting layers 34, 42, 48, 42a and 48a define a first electrode plate of the capacitor, while the second and fifth conducting layers 38 and 38a construct a second electrode plate of the capacitor. Since the electrode plate has a multi-layered stacked structure, the surface area of the electrode plates of the DRAM cell capacitor are improved which leads to a higher capacitance.

Persons skilled in the art will appreciate the fact that certain conditions, parameters, as well as materials utilized in the description of the present invention may be changed or modified without departing from the scope and spirit of the present invention's disclosure. It therefore should be pointed out that the above description, based on the described embodiments of the present invention, is only intended to describe the invention, not to limit the scope of the invention, which is defined in the claims below.

What is claimed is:

1. A method of fabricating capacitor on a semiconductor substrate having a transistor device including a gate electrode and source/drain areas, and a first insulating layer containing a first contact opening to expose one of said source/drain areas, comprising the steps of:

(a) forming and patterning a first conducting layer overlying said insulating layer, wherein said first conducting layer is connected to said source/drain areas through said first contact opening;

(b) sequentially forming a first dielectric layer, a second conducting layer, a second dielectric layer, and a third conducting layer overlying said first conducting layer and said first insulating layer;

(c) etching through portions of said third conducting layer, said second dielectric layer, and said second conducting layer to form a second contact opening;

(d) forming first sidewall spacers on sidewalls of said second contact opening;

(e) forming a fourth conducting layer overlying said third conducting layer, wherein said fourth conducting layer is connected to said first conducting layer through said second contact opening;

(f) sequentially forming a third dielectric layer, a fifth conducting layer, a fourth dielectric layer, and a sixth conducting layer overlying said fourth conducting layer and said second insulating layer, wherein said fifth conducting layer is electrically connected to said second conducting layer;

(g) etching through portions of said sixth conducting layer, said fourth dielectric layer, and said fifth conducting layer to form a third contact opening;

(h) forming second sidewall spacers on sidewalls of said third contact opening; and (i) forming a seventh conducting layer overlying said sixth conducting layer, wherein said seventh conducting layer is connected to said fourth conducting layer through said third contact opening.

2. The method of claim 1 also including the steps of patterning said fourth conducting layer, said third conducting layer, said seventh conducting layer and said sixth conducting layer to define a periphery of said capacitor, and wherein said first, third, fourth, sixth, and seventh conducting layers together define a first electrode plate, said second and fifth conducting layers define a second electrode plate.

3. The method of claim 2, wherein said first, second and third insulating layers are made of silicon dioxide.

4. The method of claim 2, wherein said first, second, third, fourth, fifth, sixth, and seventh conducting layers are made of doped polysilicon.

5. The method of claim 2, wherein said first, second, third, and fourth dielectric layers are nitride/oxide layers.

* * * * *